(12) United States Patent
Kim et al.

(10) Patent No.: US 6,384,619 B1
(45) Date of Patent: *May 7, 2002

(54) INTEGRATED CIRCUIT DEVICES HAVING METASTABILITY PROTECTION CIRCUITS THEREIN

(75) Inventors: Chang-hyun Kim, Kyungki-do; Ki-whan Song, Seoul, both of (KR)

(73) Assignee: Samsung Electronics Co., Ltd. (KR)

( * ) Notice: Subject to any disclaimer, the term of this patent is extended or adjusted under 35 U.S.C. 154(b) by 0 days.

This patent is subject to a terminal disclaimer.

(21) Appl. No.: 09/712,466

(22) Filed: Nov. 14, 2000

Related U.S. Application Data

(63) Continuation of application No. 09/320,889, filed on May 27, 1999, now Pat. No. 6,184,701.

(30) Foreign Application Priority Data

May 29, 1998 (KR) .............................. 98-19805

(51) Int. Cl.[7] ...................... H03K 17/16; H03K 19/003
(52) U.S. Cl. .......................... 326/21; 326/26; 326/27; 327/198
(58) Field of Search .......................... 326/21, 26, 83, 326/86, 27; 327/198

(56) References Cited

U.S. PATENT DOCUMENTS

| | | | |
|---|---|---|---|
| 4,282,489 A | 8/1981 | DeRienzo | 328/206 |
| 4,982,118 A | 1/1991 | Lloyd | 307/480 |
| 5,017,815 A | 5/1991 | Lloyd | 307/480 |
| 5,036,221 A | 7/1991 | Brucculeri et al. | 307/443 |
| 5,166,561 A | * 11/1992 | Okura | 327/312 |
| 5,187,385 A | * 2/1993 | Koike | 327/198 |
| 5,256,914 A | * 10/1993 | Boomer | 326/29 |
| 5,489,865 A | 2/1996 | Colvin, Sr. | 327/198 |
| 5,510,732 A | 4/1996 | Sandhu | 326/94 |
| 5,598,113 A | 1/1997 | Jex et al. | 326/94 |
| 5,789,945 A | * 8/1998 | Cline | 326/94 |
| 6,184,701 B1 | 2/2001 | Kim et al. | 326/21 |

FOREIGN PATENT DOCUMENTS

| | | | |
|---|---|---|---|
| EP | 0 492 798 A2 | 7/1992 | ........... G01R/13/34 |
| JP | 2100414 | 4/1990 | |

OTHER PUBLICATIONS

European Search Report, European Application No. 99 30 3995, Dec. 27, 2000.
Notice to Submit Response, Korean Application No. 10-1998-0099805, Jul. 31, 2000.
Rabaey, "Digital Integrated Circuits: A Design Perspective", Prentice Hall, 1996, pp. 334, 534-535.

* cited by examiner

Primary Examiner—Michael Tokar
Assistant Examiner—Steven S. Paik
(74) Attorney, Agent, or Firm—Myers Bigel Sibley & Sajovac

(57) ABSTRACT

Integrated circuit devices having metastability protection circuits therein include a main active circuit and a metastability detection/prevention circuit. The main active circuit may comprise a comparator, a sense amplifier, a differential amplifier or a voltage generating circuit, for example. The metastability detection/prevention circuit performs the function of detecting whether an output of the main active circuit has been disposed in a metastable state for a duration in excess of a transition duration. The output of the main active circuit may be considered as being in a metastable state if a potential of the output signal equals $V_{MS}$, where $V_{MS}$ is in a range between $V_{IL}$ and $V_{IH}$. If the output signal has been in a metastable state for a duration in excess of the transition duration, then the metastability detection/prevention circuit will generate a control signal at a designated logic level. This control signal is provided as an input to the main active circuit and causes the output of the main active circuit to be driven out of the metastable state (i.e., to a logic 1 or 0 level). In this manner, prolonged metastability can be prevented even if the values of the input signals to the main active circuit would otherwise dispose the output in a metastable state.

21 Claims, 4 Drawing Sheets

US 6,384,619 B1

INTEGRATED CIRCUIT DEVICES HAVING METASTABILITY PROTECTION CIRCUITS THEREIN

RELATED APPLICATION

This application is a continuation of U.S. application Ser. No. 09/320,889, filed May 27, 1999, now U.S. Pat. No. 6,184,701. This application is also related to Korean Application No. 98-19805, filed May 29, 1998, the disclosure of which is hereby incorporated herein by reference.

FIELD OF THE INVENTION

The present invention relates to integrated circuit devices, and more particularly to integrated circuit devices which may be prone to generating metastable output signals.

BACKGROUND OF THE INVENTION

Integrated circuit devices such as comparators, sense amplifiers, differential amplifiers and reference voltage generating circuits may be susceptible to generating output signals that are not always in logic 1 or 0 states. In particular, a differential amplifier which receives input signals at similar analog levels may be prone to generating an output signal in a metastable state (i.e., where the potential of the output signal is greater than a maximum logic 0 level ($V_{IL}$) and less than a minimum logic 1 level ($V_{IH}$)). Such generation of metastable outputs may result in device failure if devices that are responsive to the output signal interpret the state of the output signal incorrectly. Accordingly, there is a need to develop circuits having less susceptibility to metastable output generation.

SUMMARY OF THE INVENTION

It is therefore an object of the present invention to provide integrated circuit devices that have reduced susceptibility to metastable operation.

These and other objects, advantages and features of the present invention are provided by integrated circuit devices which include a main active circuit and a metastability detection/prevention circuit. The main active circuit may comprise a comparator, a sense amplifier, a differential amplifier or a voltage generating circuit, for example. The metastability detection/prevention circuit performs the function of detecting whether an output of the main active circuit has been disposed in a metastable state for a duration in excess of a transition duration. The output of the main active circuit may be considered as being in a metastable state if a potential of the output signal ($V_{POUT}$) equals $V_{MS}$, where $V_{MS}$ is in a range between $V_{IL}$ and $V_{IH}$. If the output signal has been in a metastable state for a duration in excess of the transition duration, then the metastability detection/prevention circuit will generate a control signal at a designated logic level. This control signal is provided as an input to the main active circuit and causes the output of the main active circuit to be driven out of the metastable state (i.e., to a logic 1 or 0 level). In this manner, prolonged metastability can be prevented even if the values of the input signals to the main active circuit would otherwise dispose the output in a metastable state.

DESCRIPTION OF PREFERRED EMBODIMENTS

The present invention will now be described more fully hereinafter with reference to the accompanying drawings, in which preferred embodiments of the invention are shown. This invention may, however, be embodied in different forms and should not be construed as limited to the embodiments set forth herein. Rather, these embodiments are provided so that this disclosure will be thorough and complete, and will fully convey the scope of the invention to those skilled in the art. Like numbers refer to like elements throughout and signal lines and signals thereon may be referred to by the same reference symbols.

Figure 1:
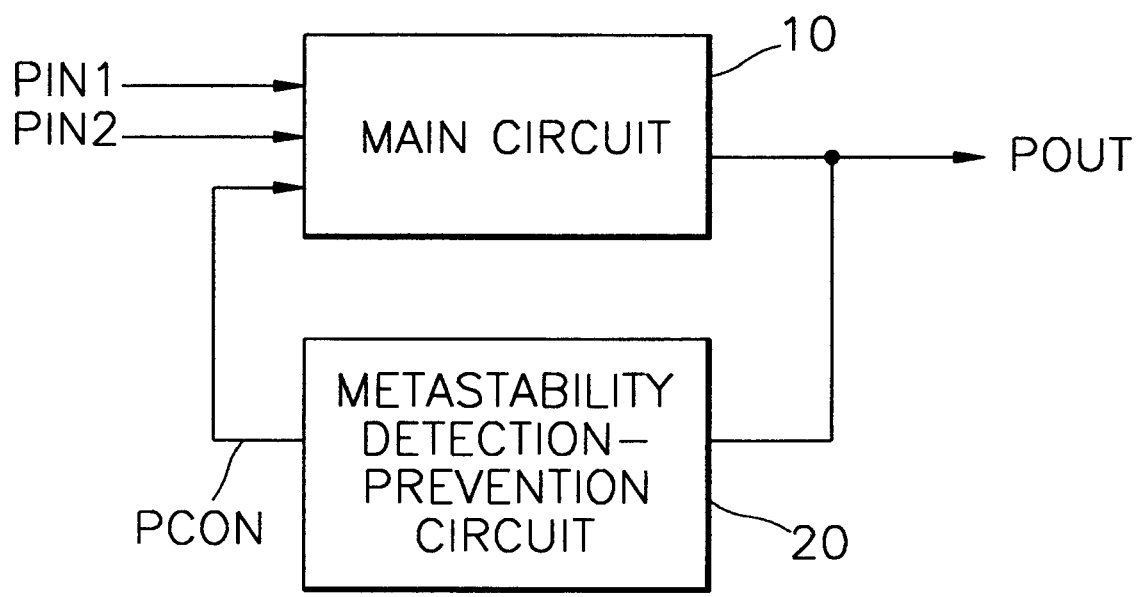
FIG. 1 is a block diagram of an integrated circuit device according to an embodiment of the present invention.
Figure 2:
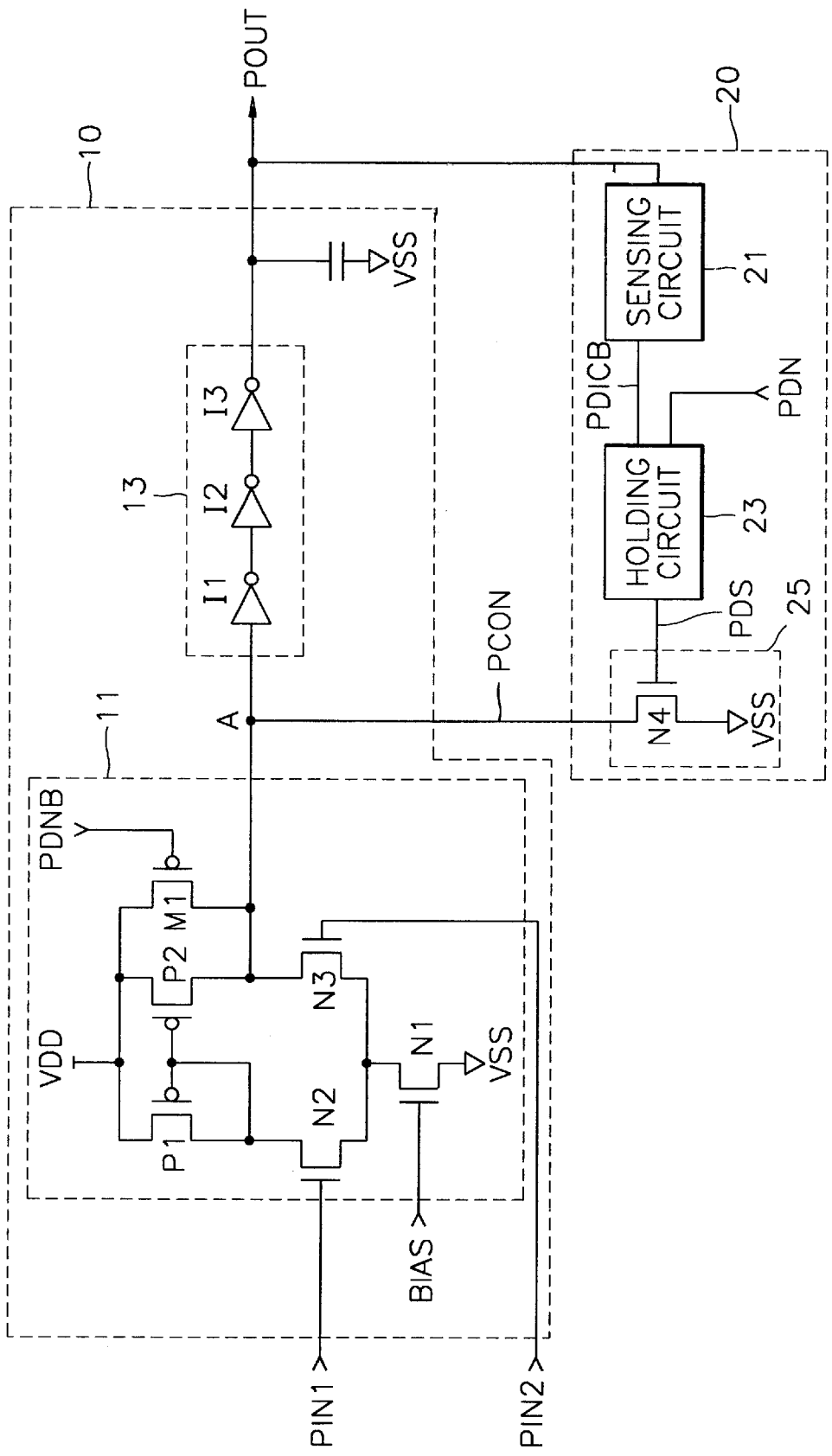
FIG. 2 is an electrical schematic of the device of FIG. 1.

Referring now to FIGS. 1–2, a preferred embodiment of an integrated circuit device according to an embodiment of the present invention includes a main active circuit 10 and a metastability detection/prevention circuit 20, connected as illustrated. The main active circuit 10, which may be responsive to first and second input signals PIN1 and PIN2, may comprise a comparator, a sense amplifier, a differential amplifier 11 (as illustrated by FIG. 2) or a voltage generating circuit, for example. The circuit 10 may also perform the function of converting an analog level signal to a CMOS level signal. Alternatively, the circuit 10 may comprise a data input buffer, an address input buffer, a data output buffer or an analog-to-digital converter, for example. As explained more fully hereinbelow with respect to FIG. 2, the metastability detection/prevention circuit 20 preferably performs the function of detecting whether the output POUT of the main active circuit 10 has been disposed in a metastable state for a duration in excess of a transition duration. As described more fully hereinbelow, the length of the transition duration is dependent on the value of a holding capacitor C1 at an output of a sensing circuit (see, e.g., FIG. 3). Here, a signal at the output POUT of the main active circuit 10 may be considered as being in a metastable state if a potential of the signal $V_{POUT}$ equals $V_{MS}$, where $V_{MS}$ is in a range between $V_{IL}$ and $V_{IH}$. These aspects of the metastability phenomenon are more fully described at pages 334 and 534–535 of a textbook by Jan M. Rabaey entitled "Digital Integrated Circuits: A Design Perspective", Prentice Hall (1996). If the signal POUT has been in a metastable state for a duration in excess of the transition duration, then the metastability detection/prevention circuit 20 will generate a control signal PCON. This control signal PCON is provided as an input to the main active circuit 10 and causes the output POUT of the main active circuit 10 to be driven to a logic 1 level (or logic 0 level), irrespective of the values of the input signals PIN1 and PIN2. In this manner, prolonged metastability can be prevented even if the values of the input signals would otherwise dispose the output POUT in a metastable state.

Referring now specifically to the device of FIG. 2, the main active device 10 is provided as a differential amplifier 11 having an output connected to a buffer circuit 13. As illustrated, the differential amplifier 11 is responsive to two input signals PIN1 and PIN2 and comprises a plurality of NMOS transistors N1-N3 and a plurality of PMOS transistors P1 and P2. A fixed bias signal BIAS is provided to the gate electrode of NMOS transistor N1 which acts as a current source. According to a preferred aspect of the active device 10, a PMOS pull-up transistor M1 is provided at the output of the differential amplifier at node A. This PMOS pull-up transistor is responsive to a complementary main circuit control signal PDNB (i.e.,/PDN) which acts as a first initialization signal. When the first initialization signal PDNB is driven to a logic 0 level, node A becomes initialized at a logic 1 level. Because the buffer circuit 13 comprises a odd-numbered string of inverters (11–13), the output POUT is driven to a logic 0 level whenever the first initialization signal PDNB is driven to a logic 0 level.

The active device also includes a metastable control input PCON which enables the output POUT to be driven from a metastable state (where $V_{POUT}=V_{MS}$) to a logic 1 state whenever the metastable control input PCON is pulled down to Vss. Alternatively, by changing the number of inverters in the buffer circuit 13, the output POUT can be driven to a logic 0 state whenever a metastable state is detected.

According to a preferred aspect of the present invention, the metastable control input PCON can be disposed in either a logic 0 state (or logic 1 state) or a high impedance state. In particular, the value of the metastable control input PCON is determined by the metastability detection circuit 20. As illustrated by FIG. 2, the metastability detection circuit 20 is responsive to the output POUT of the active device 10 and drives the metastable control input PCON to a predetermined logic state if the output POUT is disposed in the metastable state for a duration in excess of a transition duration. The preferred metastability detection circuit 20 comprises a sensing circuit 21, a holding circuit 23 and a compensating device 25. The sensing circuit 21 is responsive to the output POUT of the active device 10 and generates a sensing signal PDICB. The holding circuit 23 is responsive to the sensing signal PDICB as well as a main circuit control signal PDN which acts as a second initialization signal. The holding circuit 23 also generates a state indication signal PDS. This state indication signal PDS is provided to the compensating device 25 which may comprise a single NMOS pull-down transistor N4. When the state indication signal PDS is driven to a logic 1 state, the NMOS pull-down transistor N4 will turn on and pull the metastable control input PCON down to a logic 0 state (e.g., Vss).

Figure 3:
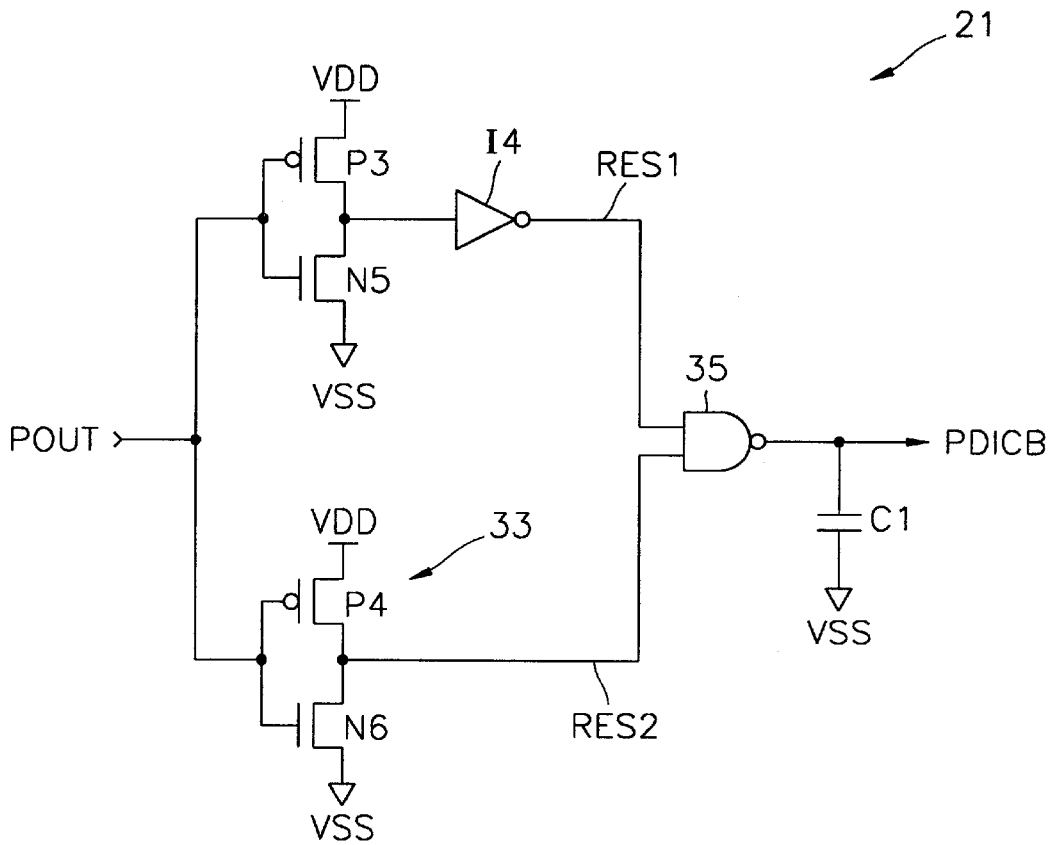
FIG. 3 is an electrical schematic of an embodiment of a sensing circuit of FIG. 2.

Referring now to FIG. 3, a preferred configuration of the sensing circuit 21 is illustrated. This sensing circuit 21 comprises a first CMOS inverter formed by PMOS pull-up transistor P3 and NMOS pull-down transistor N5, and a second CMOS inverter 33. The second CMOS inverter 33 comprises PMOS pull-up transistor P4 and NMOS pull-down transistor N6. An inverter 14 is also provided at the output of the first CMOS inverter. The output of the inverter 14 and the output of the second CMOS inverter 33 are provided as inputs to NAND gate 35. The sensing signal line PDICB at the output of the NAND gate 35 is only driven to a logic 0 state when both inputs thereto (i.e., signal lines RES1 and RES2) are established at logic 1 levels. A capacitor C1 is also provided to prevent normal 0→1 or 1→0 transitions or noise at the output POUT of the active device 10 from inadvertently driving the sensing signal PDICB to a logic 0 level. Nonetheless, when the output POUT is disposed in a metastable state for a duration in excess of a transition duration, the output of the first CMOS inverter will be driven to a logic 0 level and the output of the second CMOS inverter will be driven to a logic 1 level. This is achieved by designing PMOS pull-up transistor P3 to have a higher resistance than NMOS pull-down transistor N5 when $V_{IL}<V_{POUT}<V_{IH}$ (i.e., when the output POUT is metastable), and also by designing NMOS pull-down transistor N6 to have a higher resistance than PMOS pull-up transistor P4 when the output POUT is metastable. Accordingly, the sensing circuit 21 can detect when the output POUT is metastable, by driving both signal lines RES1 and RES2 to logic 1 levels and by driving the sensing signal line PDICB to a logic 0 level.

Figure 4:
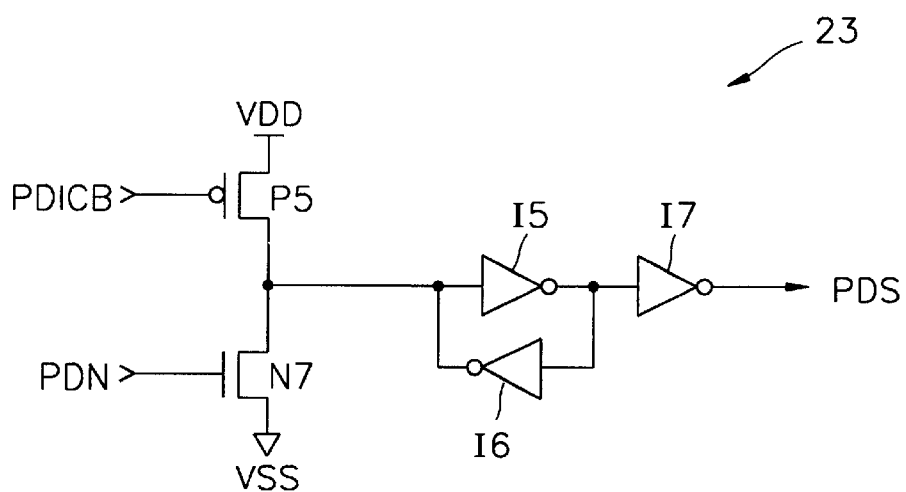
FIG. 4 is an electrical schematic of an embodiment of a holding circuit of FIG. 2.

Referring now to FIG. 4, the holding circuit receives the sensing signal PDICB as an input and generates a state indication signal PDS at a logic 1 level when PDICB is at a logic 0 level. This is achieved using the PMOS pull-up transistor P5 and a noninverting latch circuit comprising inverters 15–17. A logic 1 state indication signal PDS will then cause NMOS pull-down transistor N4 to turn on and pull the control signal line PCON to a logic 0 level. As described above, by pulling the control signal line PCON to a logic 0 level, the output POUT can be driven from the metastability state to a logic 1 state automatically. The state indication signal line PDS can also be clamped at a logic 0 level by disposing the main circuit control signal line PDN in a logic 1 state. When this occurs, the NMOS pull down transistor N7 will turn on and pull the input of inverter 15 to a logic 0 level. The complementary main circuit control signal line PDNB will also be disposed in a logic 0 state so that node A can be held at a logic 1 level and the output POUT can be held at a logic 0 level.

Figure 5:
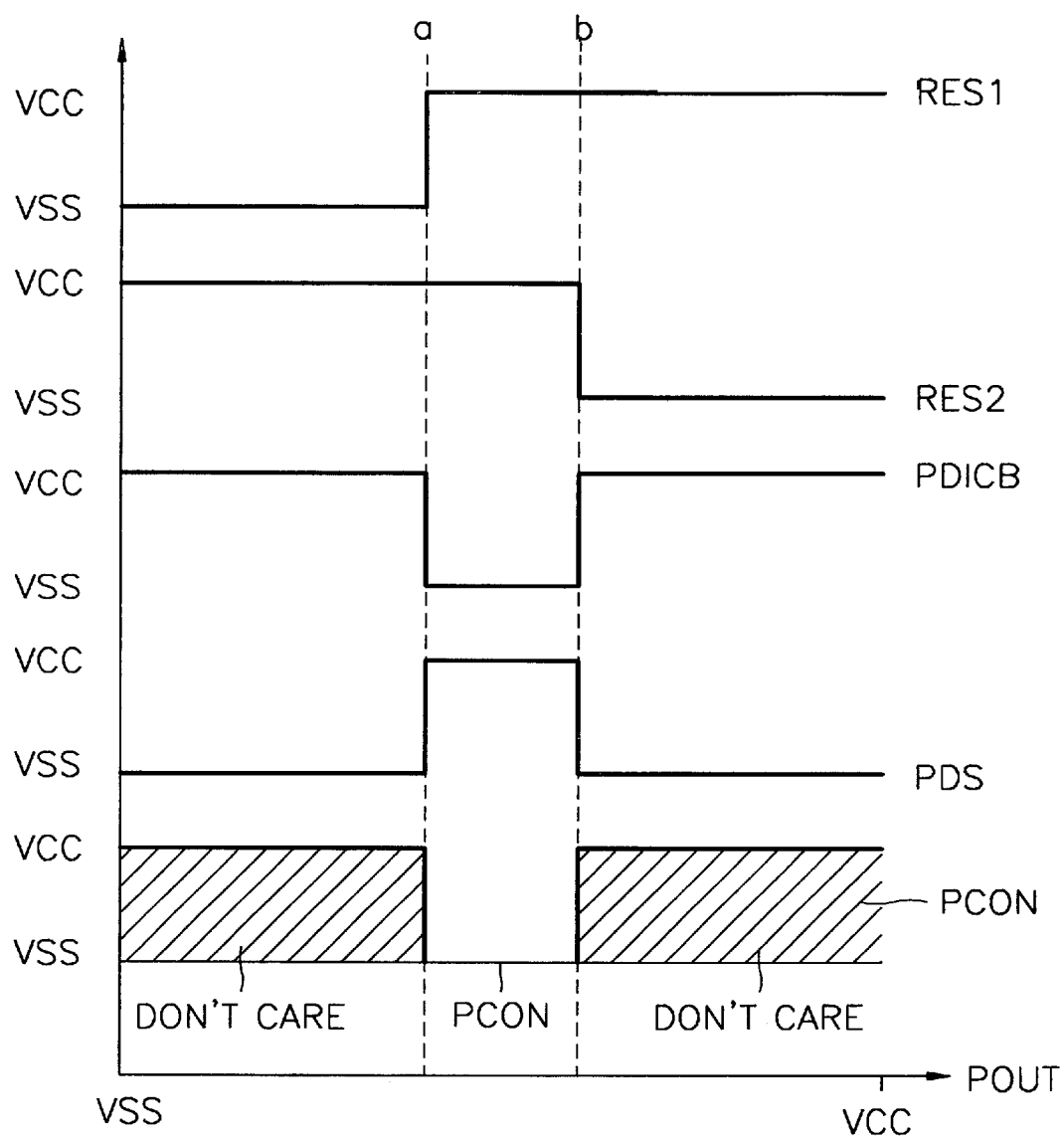
FIG. 5 is a diagram which illustrates operation of the device of FIG. 2.

Referring now to FIG. 5, the above described operation of a preferred embodiment of the present invention is illustrated by a plot on the y-axis of signal line voltages for signals RES1, RES2, PDlCB, PDS and PCON versus the output voltage POUT on the x-axis. As illustrated, the output POUT is in a metastable state when the potential of the output POUT is in the range between "a" and "b". When this metastable state is present, the sensing signal line PDICB will be driven to a logic 0 level and the state indication signal line PDS will be driven to a logic 1 level.

In the drawings and specification, there have been disclosed typical preferred embodiments of the invention and, although specific terms are employed, they are used in a generic and descriptive sense only and not for purposes of limitation, the scope of the invention being set forth in the following claims.

That which is claimed is:

1. An integrated circuit device, comprising:
   an active device having a metastable control input and an output which is driven from a metastable state to a first or second logic state whenever the metastable control input is in the first logic state; and
   a metastability detection circuit that is responsive to the output of said active device and drives the metastable control input to the first logic state if the output of said active device is disposed in the metastable state for a duration in excess of a transition duration.

2. The device of claim 1, wherein said metastability detection circuit comprises:
   a sensing circuit having an input electrically connected to the output of said active device; and
   a holding circuit having a first input electrically connected to an output of said sensing circuit.

3. The device of claim 2, wherein said active device comprises a first transistor having a gate electrode that is responsive to a first initialization signal; and wherein a second input of said holding circuit is responsive to a second initialization signal.

4. The device of claim 3, wherein the first and second initialization signals are complementary versions of each other.

5. The device of claim 4, wherein said active device has an intermediate output node; wherein the first transistor is electrically connected in series between the intermediate output node and a first reference potential; and wherein said metastability detection circuit comprises a second transistor electrically connected in series between the intermediate output node and a second reference potential.

6. The device of claim 5, wherein a gate electrode of said second transistor is electrically connected to an output of said holding circuit.

7. The device of claim 6, wherein said sensing circuit comprises:
a NAND gate having first and second inputs;
a first CMOS inverter that is biased to pull-down an output thereof if an input thereto is in the metastable state; and
a second CMOS inverter that is biased to pull-up an output thereof if an input thereto is in the metastable state.

8. The device of claim 7, wherein inputs of said first and second CMOS inverters are electrically connected together and to the output of said active device.

9. The device of claim 8, further comprising a third inverter having an input electrically coupled to the output of said first CMOS inverter; and wherein the first and second inputs of said NAND gate are electrically connected to the output of said third inverter and the output of said second CMOS inverter, respectively.

10. The device of claim 2, wherein said sensing circuit comprises:
a AND gate having first and second inputs;
a first CMOS inverter that is biased to pull-down an output thereof if an input thereto is in the metastable state; and
a second CMOS inverter that is biased to pull-up an output thereof if an input thereto is in the metastable state.

11. The device of claim 10, wherein inputs of said first and second CMOS inverters are electrically connected together and to the output of said active device.

12. The device of claim 3, further comprising a third inverter having an input electrically coupled to the output of said first CMOS inverter; and
wherein the first and second inputs of said NAND gate are electrically connected to the output of said third inverter and the output of said second CMOS inverter, respectively.

13. The device of claim 6, wherein said active device comprises a buffering circuit having an input electrically connected to the intermediate output node; and wherein an output of said buffering circuit is the output of said active device.

14. The device of claim 6, wherein said first transistor comprises a PMOS transistor; and wherein said second transistor comprises an NMOS transistor.

15. An integrated circuit device, comprising:
an active device having a metastable control input and an output which is driven from a metastable state to a first or second logic state whenever the metastable control input is in a first logic state; and
a metastability detection circuit that is responsive to the output of said active device and drives the metastable control input to the first logic state if the output of said active device is disposed in the metastable state for a duration in excess of a transition duration, said metastability detection circuit having a capacitor therein which inhibits noise at the output from being interpreted as a metastable condition.

16. The device of claim 15, wherein said metastability detection circuit comprises:
a sensing circuit having an input electrically connected to the output of said active device; and
a holding circuit having a first input electrically connected to an output of said sensing circuit.

17. The device of claim 16, wherein said active device comprises a first transistor having a gate electrode that is responsive to a first initialization signal; and wherein a second input of said holding circuit is responsive to a second initialization signal.

18. The device of claim 17, wherein the first and second initialization signals are complementary versions of each other.

19. The device of claim 18, wherein said active device has an intermediate output node; wherein the first transistor is electrically connected in series between the intermediate output node and a first reference potential; and wherein said metastability detection circuit comprises a second transistor electrically connected in series between the intermediate output node and a second reference potential.

20. The device of claim 16, wherein said sensing circuit comprises:
a NAND gate having first and second inputs;
a first CMOS inverter that is biased to pull-down an output thereof if an input thereto is in the metastable state; and
a second CMOS inverter that is biased to pull-up an output thereof if an input thereto is in the metastable state.

21. An integrated circuit device, comprising:
an active device having a metastable control input and an output which is driven from a metastable state to a first or second logic state whenever the metastable control input is in the first logic state, said active device comprising a device selected from the group consisting of a comparator, a sense amplifier, a differential amplifier, a data buffer, an address buffer and an analog-to-digital converter; and
a metastability detection circuit that is responsive to the output of said active device and drives the metastable control input to the first logic state if the output of said active device is disposed in the metastable state when said active device is not in an active state.

* * * * *